(12) United States Patent
Sado

(10) Patent No.: US 12,122,042 B2
(45) Date of Patent: Oct. 22, 2024

(54) WORKPIECE TRANSFER HAND

(71) Applicant: DAIHEN Corporation, Osaka (JP)

(72) Inventor: Daisuke Sado, Osaka (JP)

(73) Assignee: DAIHEN Corporation, Osaka (JP)

( * ) Notice: Subject to any disclaimer, the term of this patent is extended or adjusted under 35 U.S.C. 154(b) by 379 days.

(21) Appl. No.: 17/644,151

(22) Filed: Dec. 14, 2021

(65) Prior Publication Data

US 2022/0193928 A1 Jun. 23, 2022

(30) Foreign Application Priority Data

Dec. 21, 2020 (JP) ................................. 2020-211315

(51) Int. Cl.
*B25J 15/06* (2006.01)
*B25J 11/00* (2006.01)
*H01L 21/683* (2006.01)

(52) U.S. Cl.
CPC ........ *B25J 15/0683* (2013.01); *B25J 11/0095* (2013.01); *H01L 21/6838* (2013.01)

(58) Field of Classification Search
CPC B25J 15/0014; B25J 15/0616; B25J 15/0683; B25J 11/0095; H01L 21/6838
See application file for complete search history.

(56) References Cited

U.S. PATENT DOCUMENTS

| 4,529,353 | A | * | 7/1985 | Dean | B65G 47/91 414/404 |
| 4,631,815 | A | * | 12/1986 | Bocchicchio | H05K 13/0473 294/185 |
| 5,937,993 | A | * | 8/1999 | Sheets | B25B 11/005 269/21 |
| 6,837,672 | B1 | * | 1/2005 | Tateyama | H01L 21/68707 414/815 |

(Continued)

FOREIGN PATENT DOCUMENTS

| CN | 109366514 A | * | 2/2019 | |
| DE | 102017124472 B3 | * | 2/2019 | ............. B25J 15/06 |

(Continued)

OTHER PUBLICATIONS

Office Action received in corresponding Japanese Patent application No. 2020-211315, Aug. 6, 2024, and machine translation (6 pages).

*Primary Examiner* — Dean J Kramer
(74) *Attorney, Agent, or Firm* — HSML P.C.

(57) ABSTRACT

A workpiece transfer hand includes a support plate and a suction unit on the upper surface of the plate. The upper surface of the plate has a recess whose bottom is formed with first and second pressure ports. The suction unit includes an elevator, elastic member, and first/second cylindrical members. The elevator, vertically movable in the recess along a stroke, has a vertical suction hole. The elastic member biases the elevator upward or downward. The first cylindrical member expands and contracts vertically, with its (Continued)

upper end connected to the elevator to surround the suction hole and its lower end connected to the bottom of the recess to surround the first pressure port. The second cylindrical member expands and contracts vertically, with its upper end connected to the elevator and its lower end connected to the bottom of the recess to surround the second pressure port.

5 Claims, 6 Drawing Sheets

(56) References Cited

U.S. PATENT DOCUMENTS

2012/0107081 A1    5/2012   Furuta et al.

FOREIGN PATENT DOCUMENTS

| JP | 62-215117 A   | 9/1987  |
|----|---------------|---------|
| JP | 2004-82229 A  | 3/2004  |
| JP | 2008-277613 A | 11/2008 |
| JP | 2012-99621 A  | 5/2012  |

* cited by examiner

WORKPIECE TRANSFER HAND

FIELD

The present disclosure relates to a workpiece transfer hand used in an apparatus for transferring a planar workpiece such as a substrate.

BACKGROUND

A transfer apparatus is conventionally known that transfers thin, planar workpieces, such as glass substrates used to manufacture liquid crystal displays or semiconductor wafers used to manufacture semiconductor devices. Such a transfer apparatus is typically provided with a hand with a suction function using negative pressure as an end-effector of a robot arm. As disclosed in Patent Document 1 or JP-A-2012-099621, such a suction function may be realized by suction pads provided on the upper surface of the hand. These suction pads are configured to be switchable between a state subjected to negative pressure and a state not subjected to negative pressure. A planar workpiece placed on the hand is held tightly to the suction pads due to the negative pressure applied to the suction pads. This makes it possible to transfer the planar workpiece at high speed without dropping it from the hand.

Such a transfer apparatus for planar workpieces is used, for example, to take out a workpiece from a cassette and deliver it to a processing apparatus, or to receive a workpiece from a processing apparatus and store it in a cassette. To take out a planar workpiece from a cassette, the hand is put under the workpiece, with the negative pressure to the suction pads released. In this state, the hand is raised to place the planar workpiece on the hand, and negative pressure is applied to the suction pads to tightly hold the planar workpiece. Then, the hand is pulled out from the cassette. On the other hand, to store a planar workpiece in a cassette, the hand tightly holding a planar workpiece using the negative pressure applied to the suction pads is inserted into the cassette. Thereafter, the negative pressure to the suction pads is released to allow the planar workpiece to be simply placed on the hand, and then, the hand is lowered to transfer the planar workpiece to a shelf of the cassette. The hand is then pulled out from the cassette.

With recent increase in size of planar workpieces, deflection of the workpieces stored in a cassette tends to become large. Moreover, a plurality of workpieces with different thicknesses may need to be transferred individually (or collectively) from a cassette to a processing apparatus, and the amount of deflection of the planar workpiece in the cassette may differ from each other.

Meanwhile, to improve the processing efficiency, the vertical spacing between planar workpieces in the cassette needs to be reduced so that the cassette can store as many workpieces as possible.

JP-A-2012-099621 discloses changing the amount of protrusion of the suction pads relative to the hand. With such a technique, even when the vertical spacing between planar workpieces in the cassette is small, reducing the protrusion of the suction pads allows the hand to be inserted into the cassette while avoiding contact with planar workpieces other than the planar workpiece to be transferred.

More specifically, the technique disclosed in the above patent document is as follows. Two downwardly expanding annular legs, inner and outer, which can be elastically deformable, are provided on the lower surface of each suction pad. The internal space (the first space) defined by the inner annular leg is connected to a first negative pressure path for exerting the suction action. The annular space (second space) between the inner annular leg and the outer annular leg is connected to a second negative pressure path. In this configuration, when no negative pressure is applied to the first and second negative pressure paths, the suction pad is positioned relatively high (i.e., the protrusion is large) due to the elastic force of the inner and outer annular legs. By applying negative pressure to the second negative pressure path (and hence to the second space), the suction pad is positioned relatively low (i.e., the protrusion is reduced). By applying negative pressure to the first negative pressure path, the planar workpiece is suctioned to the upper surface of the suction pad regardless of whether the suction pad is at the high position or the low position.

In the configuration disclosed in the above patent document, the parts that always bias the suction pad upward (i.e., the inner and outer double annular legs) also serve as the parts to define the first space (connected to the first negative pressure path to apply negative pressure to the upper surface of the suction pad) and the second space (connected to the second negative pressure path). For this reason, the protrusion amount of the suction pad cannot be stabilized when the planar workpiece is suctioned on the suction pad (i.e., when negative pressure is applied to the first negative pressure path). Thus, there is still room for improvement.

Patent Document 1: JP-A-2012-099621

SUMMARY

In light of the above circumstances, the present disclosure aims, for example, to provide a workpiece transfer hand that enables selecting the amount of protrusion of a suction unit from the hand while ensuring stability.

To solve the above problems, the following technical measures are taken.

The workpiece transfer hand provided according to the present disclosure includes a support plate and at least one suction unit provided on the upper surface of the support plate. The upper surface of the support plate is formed with a recess, and the recess has a first pressure port and a second pressure port at the bottom thereof. The suction unit includes: an elevator guided in the recess to move up and down along a predetermined stroke, the elevator being formed with a suction hole penetrating in a vertical direction; an elastic member constantly biasing the elevator in one of an upward direction and a downward direction; a first cylindrical member capable of expanding and contracting in the vertical direction and having an upper end connected to the elevator so as to surround the suction hole and a lower end connected to the bottom of the recess so as to surround the first pressure port; and a second cylindrical member capable of expanding and contracting in the vertical direction and having an upper end connected to the elevator and a lower end connected to the bottom of the recess so as to surround the second pressure port.

Preferably, the first cylindrical member and the second cylindrical member have a shape of a bellows.

Preferably, the elastic member constantly biases the elevator in the upward direction, the first pressure port is connected to a negative pressure source via a first on-off valve, and the second pressure port is connected to an additional negative pressure source via a second on-off valve.

Preferably, the elastic member constantly biases the elevator in the downward direction, the first pressure port is connected to a negative pressure source via a first on-off valve, and the second pressure port is connected to a positive pressure source via a second on-off valve.

Preferably, the elevator has an upper surface provided with an elastically deformable suction member flaring upward.

In the above workpiece transfer hand, in the case where the elastic member constantly (i.e., always) biases the elevator in the upward direction and the first pressure port and the second pressure port are connected to different negative pressure sources, the elevator takes a raised position with increased protrusion from the support plate due to the action of the elastic member when negative pressure is not applied to the second pressure port. In contrast, when negative pressure is applied to the second pressure port, the elevator moves downward against the elastic force of the elastic member to take a lowered position, reducing the protrusion relative to the support plate. Regardless of whether the elevator is at the raised position or at the lowered position, negative pressure can be applied to the suction hole of the elevator by applying negative pressure to the first pressure port, so that the planar workpiece can be suctioned and held on the elevator. That is, the amount of protrusion of the elevator relative to the support plate can be changed, and the planar workpiece can be suctioned and held regardless of the protrusion amount of the elevator.

Thus, even when the vertical spacing between planar workpieces W stored in a cassette (or to be stored in a cassette) is small due to the deflection of a planar workpiece W (or a difference in deflection between vertically adjacent planar workpieces W), transferring planar workpieces W to and from a cassette can be performed properly by reducing the protrusion of the elevator in inserting or pulling out the hand into and from a cassette.

Moreover, the above workpiece transfer hand has a mechanism (elastic member) that constantly bias the elevator in the vertical direction, separately from the mechanism (first cylindrical member) for applying negative pressure to the suction hole regardless of the vertical position of the elevator. Such a configuration stabilizes the vertical position of the elevator when it holds a planar workpiece due to the negative pressure applied to the suction hole.

DRAWINGS

EMBODIMENTS

Preferred embodiments of the present disclosure are disclosed below with reference to the accompanying drawings.

Figure 1:
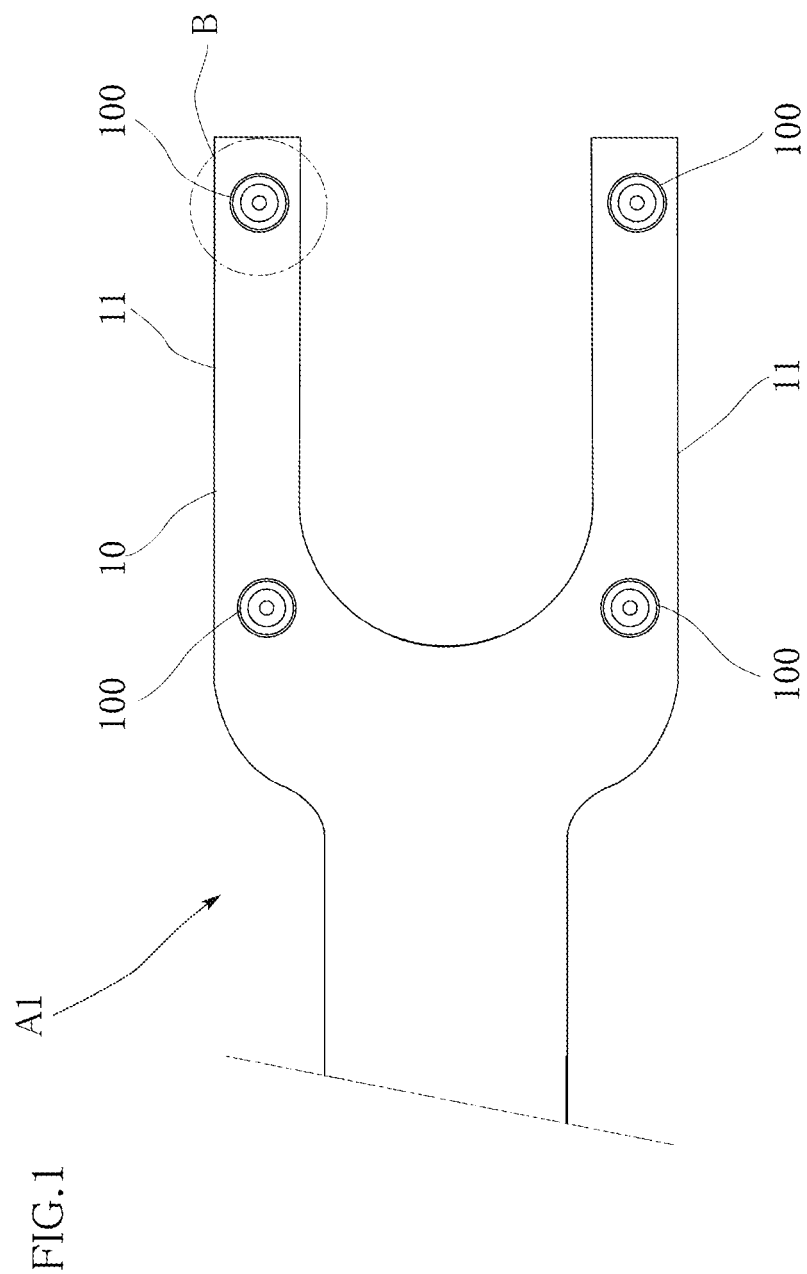
FIG. 1 is a plan view showing a workpiece transfer hand according to an embodiment of the present disclosure.
Figure 2:
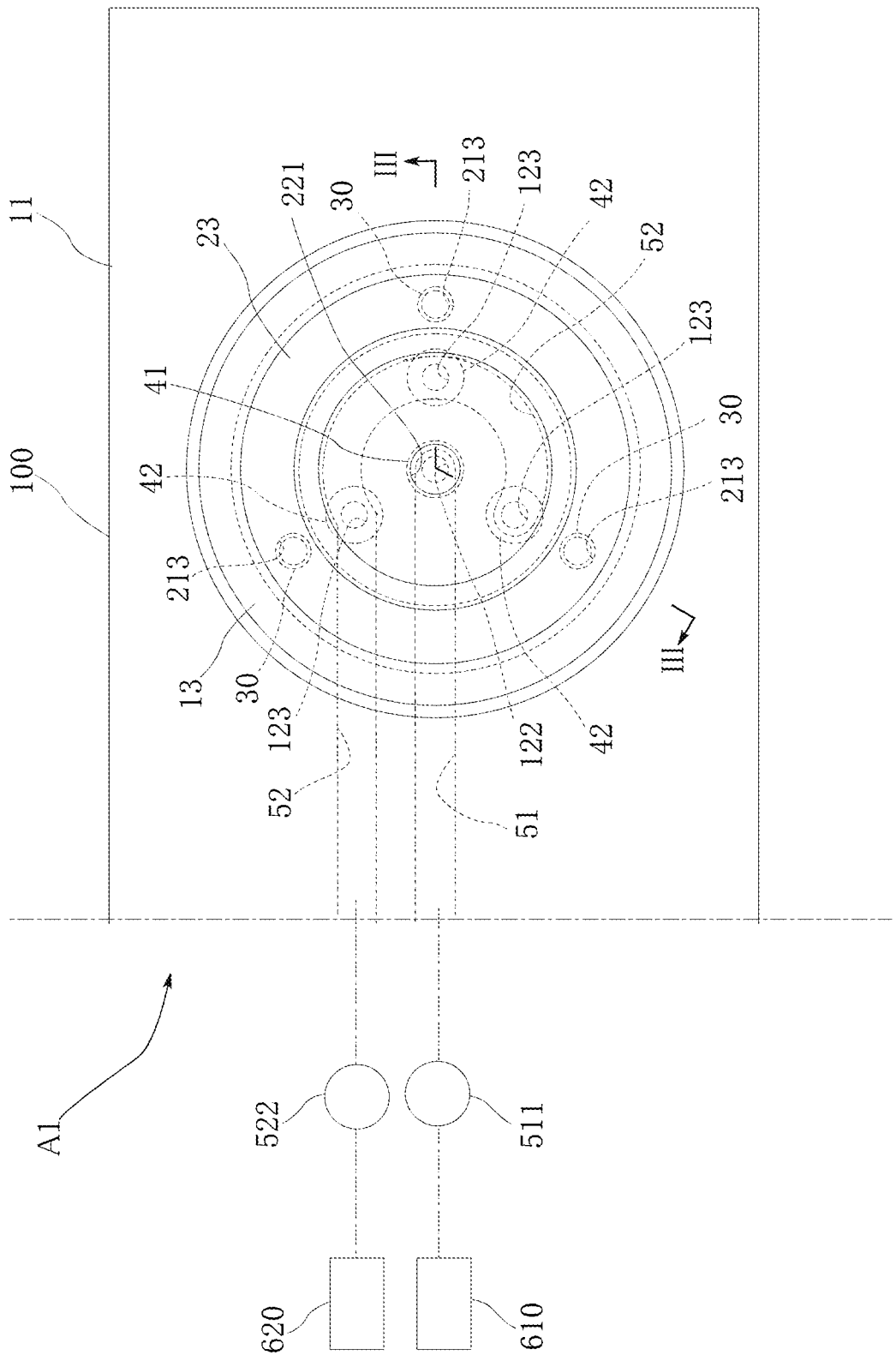
FIG. 2 is a schematic enlarged plan view showing the portion "B" in FIG. 1.
Figure 3:
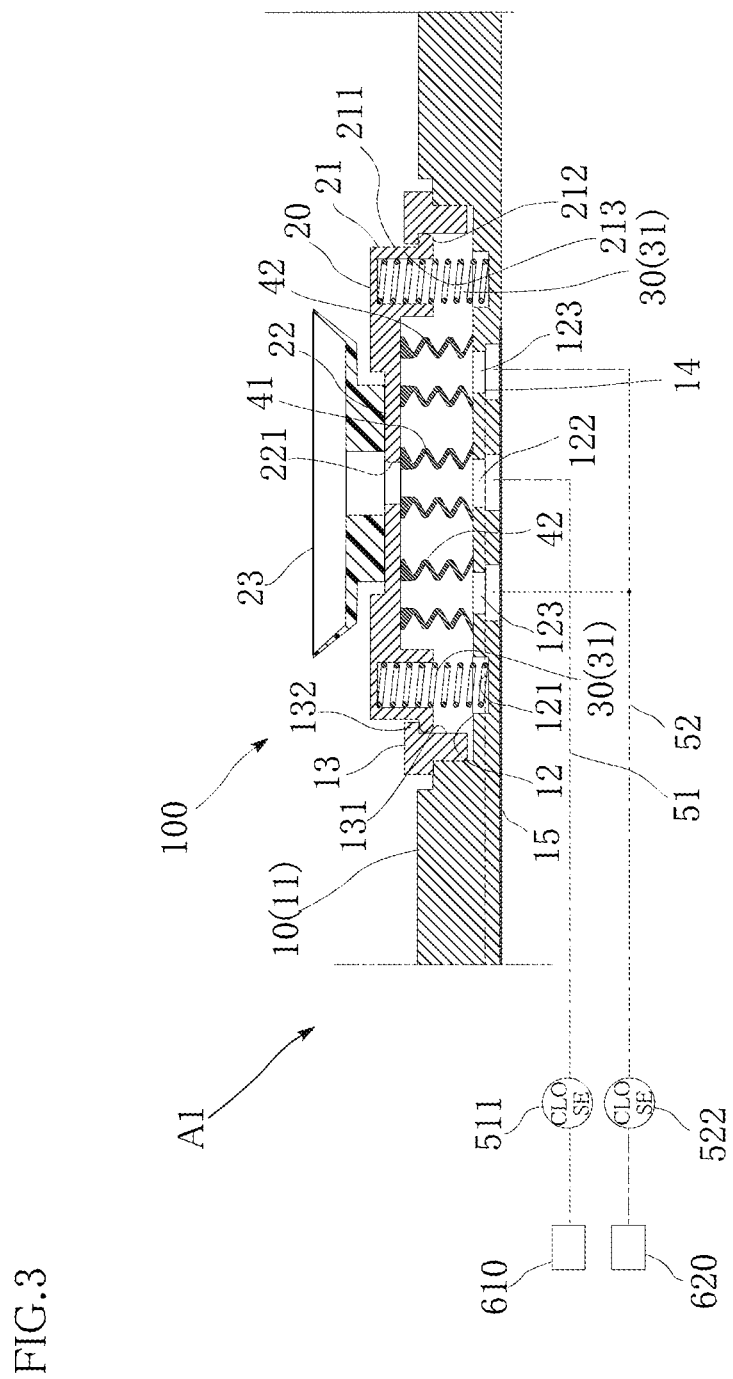
FIG. 3 is a sectional view taken along line III-III in FIG. 2.

FIGS. 1 to 3 show a workpiece transfer hand based on an embodiment of the present disclosure. The illustrated workpiece transfer hand A1 includes at least one support plate 10 provided with a plurality of suction units 100. In the present embodiment, each suction unit 100 is provided on the upper surface of the support plate 10 to properly suction and hold a planar workpiece placed on the support plate 10. Specifically, as shown in FIG. 3, a portion (lower portion) of the suction unit 100 is received in a recess formed on the upper surface of the support plate 10, and the remaining part (upper portion) of the suction unit protrudes outward (above the upper surface of the support plate 10) from the recess. As will be understood from FIGS. 4 to 6, the lower portion of the suction unit 100 received in the recess is not static, but varies depending on the operating condition of the suction unit 100.

In the present embodiment, the support plate 10 has a pair of prongs 11 extending horizontally as one piece in a bifurcated manner as viewed in plan from a base member connected to an arm end of a transfer robot (not shown). The support plate 10 may be made of a highly rigid lightweight material such as carbon fiber reinforced plastics.

In the present embodiment, the suction units 100 are provided at two locations, i.e., on the tip side and on the base side of each prong 11 (four locations in total). The specific configuration of each suction unit 100 is described below.

The support plate 10 is formed with a recess 12 (see FIG. 3), which may be circular as viewed in plan, and an elevator 20 is provided to be guided for up-down movement at a certain stroke relative to the recess 12. A ring-shaped guide member 13 is fitted in the recess 12. The guide member 13 has a guide surface 131 in the form of a cylindrical inner surface, and also has an inward flange 132 adjacent to the upper end of the guide surface 131, which defines the upper end of the movement stroke of the elevator 20.

The elevator 20 is circular as viewed in plan and includes an outer circumferential thicker portion 21 and an inner circumferential thinner portion 22. The thicker portion 21 has a cylindrical outer surface 211 and is formed with an outward flange 212 adjacent to the lower end of the cylindrical outer surface 211. The outer diameter of the cylindrical outer surface 211 generally corresponds to the inner diameter of the inward flange 132 of the guide member 13. The outer diameter of the outward flange 212 generally corresponds to the inner diameter of the guide surface 131 of the guide member 13. With such a configuration, the elevator 20 is movable up and down by being guided by the guide member 13, and the upper end of the up-down stroke is defined by the outward flange 212 of the elevator 20 coming into contact with the lower surface of the inward flange 132 of the guide member 13.

In the present embodiment, the elevator 20 is constantly (i.e., always) biased upward by at least one elastic member 30. Specifically, the thicker portion 21 of the elevator 20 is formed with downward cylindrical recesses 213 at three locations that are spaced 120° apart in the circumferential direction. Also, the recess 12 of the support plate 10 is formed with three engagement recesses 121 at locations facing the above three cylindrical recesses 213, respectively. A compression coil spring as the elastic member 30 is disposed in each pair of a cylindrical recess 213 and an engagement recess 121. The upper end of the compression coil spring is engaged in the cylindrical recess 213 of the elevator 20, and the lower end of the compression coil spring is engaged in the engagement recess 121. In this way, three compression coil springs are disposed between the support plate 10 and the elevator 20.

The elevator 20 is formed with a suction hole 221 penetrating in the vertical thickness direction at the center thereof. Because of the configuration described below, negative pressure can be applied to the suction hole 221 regardless of where in the up-down stroke the elevator 20 is positioned. That is, the support plate 10 is provided with a first pressure port 122 at the center of the bottom of the recess 12. Also, a bellows member as a first cylindrical member 41 that can be expanded and contracted in the vertical direction is provided, with its upper end connected to the lower surface of the elevator 20 to surround the suction hole 221 and its lower end connected to the recess 12 of the support plate 10 to surround the first pressure port 122. The first cylindrical member 41 (bellows member) is preferably made of rubber, but the present disclosure is not limited to this.

Meanwhile, a mechanism that uses the action of negative pressure is provided to allow the elevator 20 to be lowered against the elastic force of the elastic members 30. Specifically, the support plate 10 is provided with a second pressure port 123 at the bottom of the recess 12, and a bellows member as a second cylindrical member 42 that can be expanded and contracted in the vertical direction is also provided. The upper end of the bellows member is connected to the lower surface of the elevator 20, and the lower end of the bellows member is connected to the recess 12 of the support plate 10 to surround the second pressure port 123. The second cylindrical member 42 (bellows member) is preferably made of rubber, but the present disclosure is not limited to this. In the present embodiment, the structure consisting of the second pressure port 123 and the second cylindrical member 42 is provided at three locations spaced 120° apart in the circumferential direction around the center of the elevator 20.

The first pressure port 122 is connected to a negative pressure source 610 such as a vacuum pump through a first negative pressure path 51 having a first on-off (open/close) valve 511 in the middle. The second pressure ports 123 are connected to a negative pressure source 620 such as a vacuum pump through a second negative pressure path 52 having a second on-off valve 522 in the middle. In the present embodiment, in the region inside the support plate 10, the first negative pressure path 51 is provided by forming a groove 14 in the lower surface of the support plate 10 and closing the lower opening of the groove 14 with a thin plate 15. Similarly, the second negative pressure path 52 is provided by forming a groove 14 in the lower surface of the support plate 10 and closing the lower opening of the groove 14 with the same thin plate 15.

In the present embodiment, a suction member 23 gradually flaring upward is provided on the upper surface of the elevator 20 so as to surround the suction hole 221. The suction member 23 is made of rubber, for example, and elastically deformable. As another example, such a suction member 23 may not be provided.

The operation and advantages of the workpiece transfer hand A1 are described below.

Figure 5:
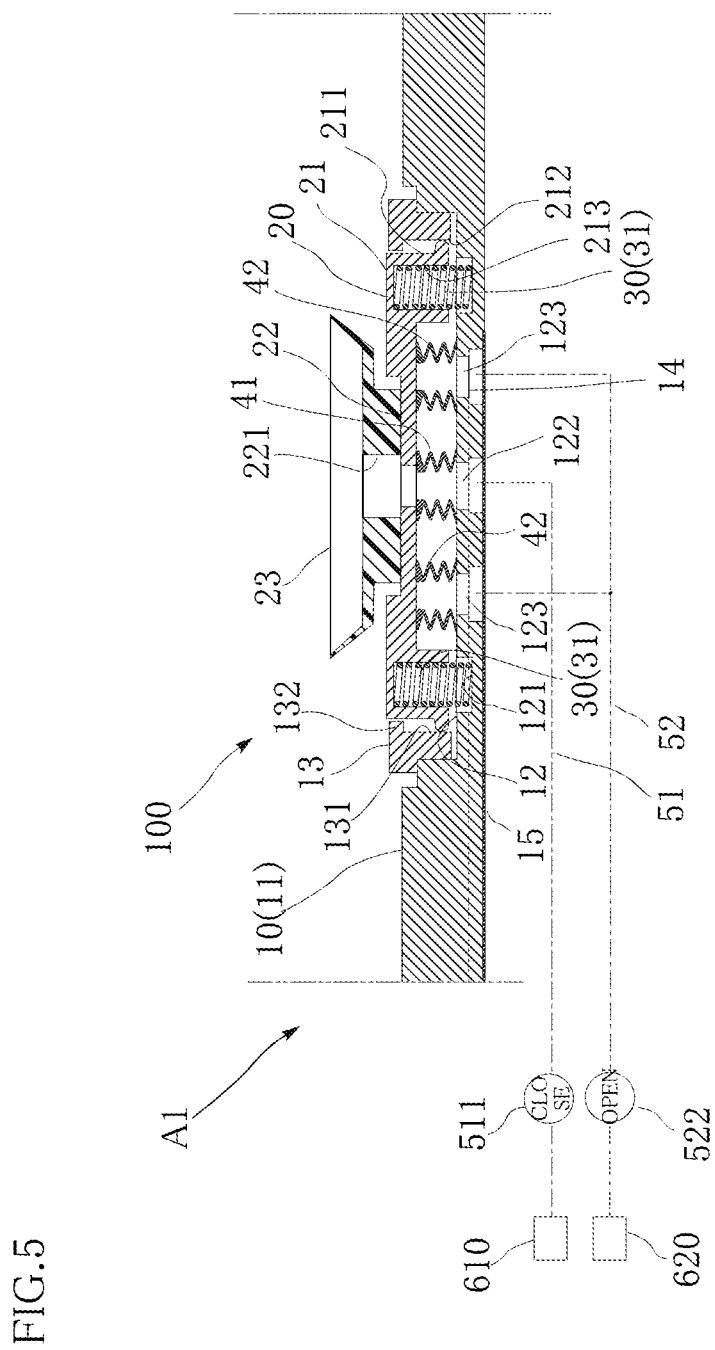
FIG. 5 is a view for describing the operation of the workpiece transfer hand and corresponds to the sectional view taken along line III-III in FIG. 2.

As shown in FIG. 3, when negative pressure to the second pressure ports 123 is blocked by the operation of the second on-off valve 522, the upward biasing force by the elastic members 30 (compression coil springs 31) positions the elevator 20 at the upper end of the up-down stroke with a large protrusion relative to the support plate 10. As shown in FIG. 5, when negative pressure is applied to the second pressure ports 123, the bellows members as the second cylindrical members 42 contract to reduce the protrusion of the elevator 20 relative to the support plate 10. In the present embodiment, the elastic members 30 are disposed at three equally spaced locations around the center of the elevator 20, and the elements to lower the elevator 20, consisting of the second pressure ports 123 and the second cylindrical members 42 (bellows members), are also disposed at three equally spaced locations around the center of the elevator 20. Such a configuration prevents the elevator 20 from tilting and being locked due to imbalanced interference with the guide member 13 during the up-down movement, allowing the elevator 20 to move up and down smoothly.

Figure 4:
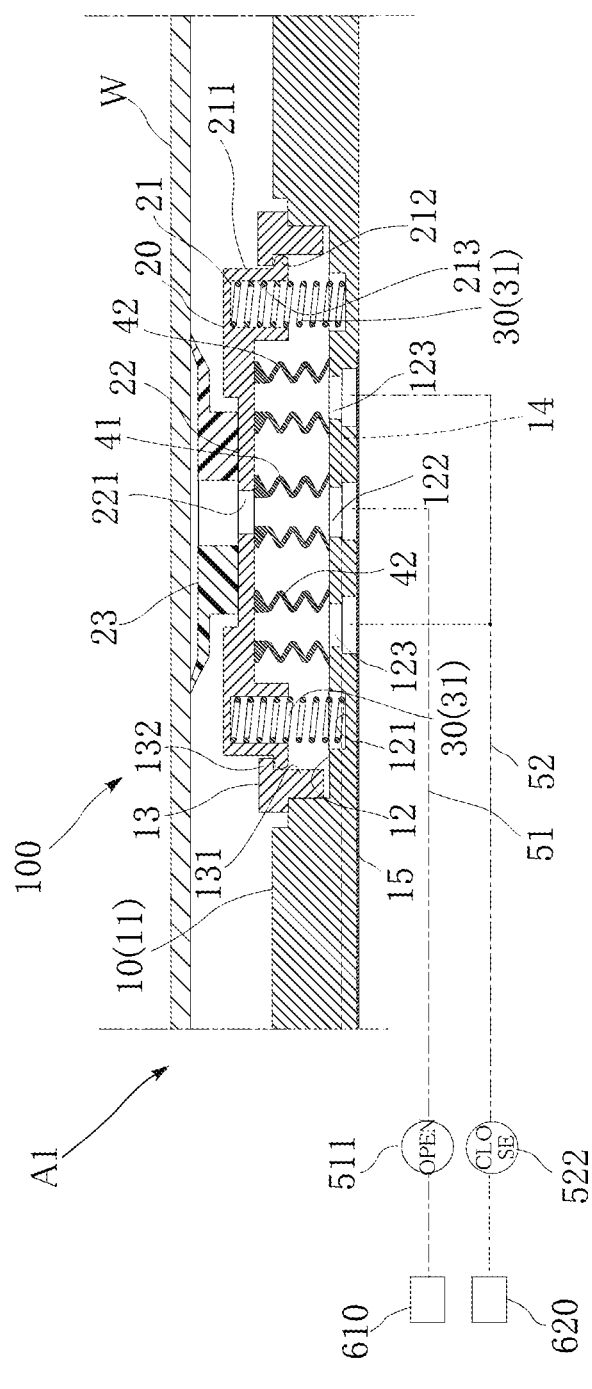
FIG. 4 is a view for describing the operation of the workpiece transfer hand and corresponds to the sectional view taken along line III-III in FIG. 2.
Figure 6:
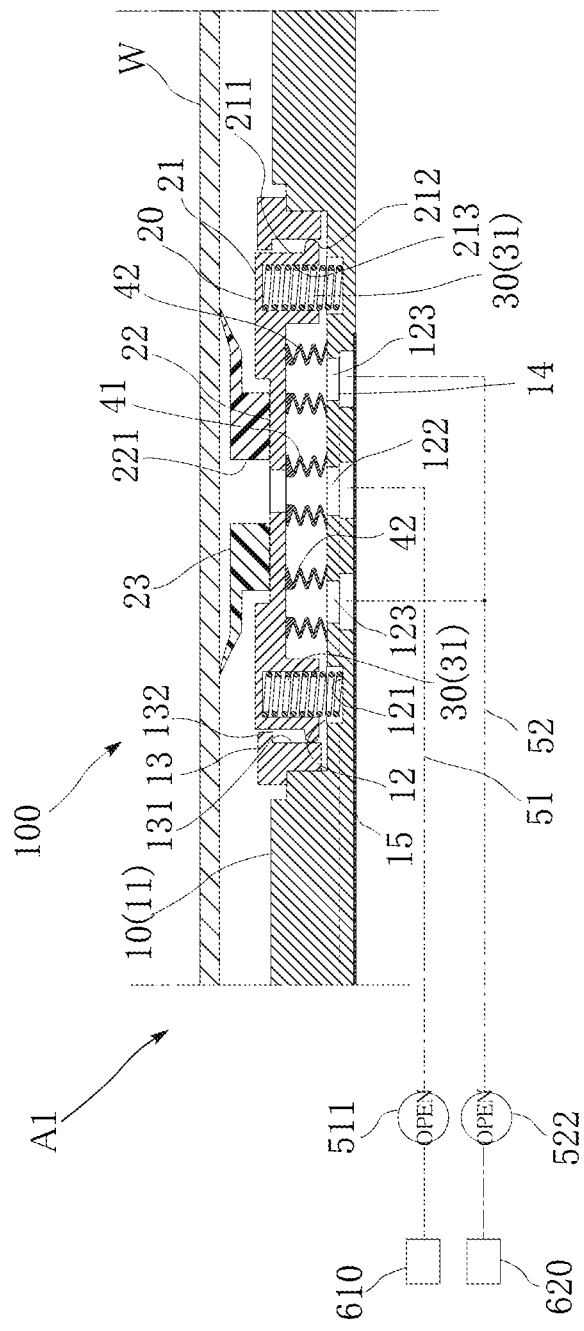
FIG. 6 is a view for describing the operation of the workpiece transfer hand and corresponds to the sectional view taken along line III-III in FIG. 2.

As shown in FIGS. 4 and 6, both when the elevator 20 is at the upper end of the up-down stroke and when the elevator is at the lower end of the up-down stroke, negative pressure, when applied to the first pressure port 122 by the operation of the first on/off valve 511, acts on the suction hole 221 of the elevator 20 and hence on the suction member 23 through the first cylindrical member 41 (bellows member). This allows the planar workpiece W placed on the workpiece transfer hand A1 to be properly suctioned and held from the lower side.

In this way, the workpiece transfer hand A1 having the above configuration can change the amount of protrusion of the elevator 20 relative to the support plate 10 as appropriate and can also suction and hold the planar workpiece W properly regardless of the protrusion amount of the elevator 20.

Thus, even when the vertical spacing between planar workpieces W stored in a cassette is small due to the deflection of a single planar workpiece W (or a difference in deflection between vertically adjacent planar workpieces W), transferring planar workpieces W to and from a cassette can be performed properly by reducing the protrusion of the elevator 20 in inserting or pulling out the workpiece transfer hand A1 into and from a cassette.

The workpiece transfer hand A1 has a mechanism (elastic members 30) that always biases the elevator 20 in the vertical direction, separately from the mechanism (first cylindrical member 41) for applying negative pressure to the suction hole 221 regardless of the vertical position of the elevator 20. Such a configuration stabilizes the vertical position of the elevator 20 when it holds a planar workpiece W due to the negative pressure applied to the suction hole 221.

The present disclosure is not limited to the foregoing embodiment. The foregoing embodiment may be varied as follows.

That is, tension coil springs may be used as the elastic members 30 to always bias the elevator 20 downward. Also, an apparatus (e.g., a compressor) that generates positive pressure may be used as the pressure source to act on the second pressure ports 123.

In this variation, when positive pressure to the second pressure ports 123 is blocked by the operation of the second on-off valve, the downward biasing force by the elastic members 30 (tension coil springs) positions the elevator 20 at the lower end of the up-down stroke due, with reduced protrusion relative to the support plate 10. When positive pressure is applied to the second pressure ports 123, the second cylindrical members 42 (bellows members) are stretched, positioning the elevator 20 at the upper end of the up-down stroke, with increased protrusion relative to the support plate 10.

Both when the elevator 20 is at the upper end of the up-down stroke and when the elevator 20 is at the lower end of the up-down stroke, negative pressure, when applied to the first pressure port 122 by the operation of the first on/off valve 511, acts on the suction hole 221 of the elevator 20 and hence on the suction member 23 through the first cylindrical member 41 (bellows member). Thus, the lower surface of the planar workpiece W placed on the workpiece transfer hand A1 is suctioned, so that the planar workpiece W is held properly.

The matters described in each claim can be changed as appropriate within the scope of the technical concept of the present disclosure.

| LIST OF REFERENCE CHARACTERS | | |
|---|---|---|
| A1: Workpiece transfer hand | W: Planar workpiece | 10: Support plate |
| 12: Recess | 122: First pressure port | 123: Second pressure port |
| 20: Elevator | 221: Suction hole | 30: Elastic member |
| 41: First cylindrical member | 42: Second cylindrical member | |
| 51: First negative pressure path | | |
| 52: Second negative pressure path | | |
| 100: Suction unit | 610, 620: Negative pressure source | |

The invention claimed is:

1. A workpiece transfer hand comprising:

a support plate; and at least one suction unit provided on an upper surface of the support plate, wherein the upper surface of the support plate is formed with a recess, the recess having a first pressure port and a second pressure port at a bottom thereof, and the suction unit includes:

an elevator guided in the recess to move up and down along a predetermined stroke, the elevator being formed with a suction hole penetrating in a vertical direction;

an elastic member constantly biasing the elevator in one of an upward direction and a downward direction;

a first cylindrical member capable of expanding and contracting in the vertical direction and having an upper end connected to the elevator so as to surround the suction hole and a lower end connected to the bottom of the recess so as to surround the first pressure port; and a second cylindrical member capable of expanding and contracting in the vertical direction and having an upper end connected to the elevator and a lower end connected to the bottom of the recess so as to surround the second pressure port, the elevator includes an outer circumferential thicker portion and an inner circumferential thinner portion, the outer circumferential thicker portion being formed with a cylindrical recess, the recess of the support plate is formed with an engagement recess facing the cylindrical recess, and the elastic member includes an upper end engaged in the cylindrical recess and a lower end engaged in the engagement recess.

2. The workpiece transfer hand according to claim 1, wherein the first cylindrical member and the second cylindrical member have a shape of a bellows.

3. The workpiece transfer hand according to claim 1, wherein the elastic member constantly biases the elevator in the upward direction, the first pressure port is connected to a negative pressure source via a first on-off valve, and the second pressure port is connected to an additional negative pressure source via a second on-off valve.

4. The workpiece transfer hand according to claim 1, wherein the elastic member constantly biases the elevator in the downward direction, the first pressure port is connected to a negative pressure source via a first on-off valve, and the second pressure port is connected to a positive pressure source via a second on-off valve.

5. The workpiece transfer hand according to claim 1, wherein the elevator has an upper surface provided with an elastically deformable suction member flaring upward.

* * * * *